United States Patent [19]

Khan

[11] Patent Number: 4,806,800

[45] Date of Patent: Feb. 21, 1989

[54] TTL-TO-ECL INPUT TRANSLATOR/DRIVER CIRCUIT

[75] Inventor: Aurangzeb K. Khan, San Bruno, Calif.

[73] Assignee: Tandem Computers Incorporated, Cupertino, Calif.

[21] Appl. No.: 123,507

[22] Filed: Nov. 20, 1987

[51] Int. Cl.$^4$ ............................................. H03K 19/092
[52] U.S. Cl. ..................................... 307/475; 307/362; 307/455; 307/494
[58] Field of Search ................................ 307/454–456, 307/475, 494, 362, 246, 264, 270

[56] References Cited

U.S. PATENT DOCUMENTS

| | | | |
|---|---|---|---|
| 4,533,842 | 8/1985 | Yang et al. | 307/455 X |
| 4,593,211 | 6/1986 | Belforte | 307/454 X |
| 4,642,482 | 2/1987 | Kasperkovitz et al. | 307/475 X |
| 4,698,527 | 10/1987 | Matsumoto | 307/455 X |
| 4,700,087 | 10/1987 | Stroberger | 307/475 |
| 4,736,125 | 4/1988 | Yuen | 307/455 X |
| 4,739,194 | 4/1988 | Glasby et al. | 307/455 |

Primary Examiner—David Hudspeth
Attorney, Agent, or Firm—Townsend and Townsend

[57] ABSTRACT

The present invention provides a high speed low power electrical circuit for converting true TTL level signals to true ECL level signals. The circuit only has a single buffer delay with some small additional delay due to an input emitter follower stage. The circuit includes a clamped, switched emitter follower which acts as a level shifting comparator; a self-centering reference threshold translator; a clamped level shifted input translator; and, an ECL Buffer Driver. The circuit also includes a TTL reference and an ECL reference which are tied together. If the TTL reference level shifts slightly due to temperature changes, supply voltage shifts or other factors, the ECL voltage reference will automatically shift by an appropriate percentage to compensate for the original shift in the TTL reference.

7 Claims, 2 Drawing Sheets

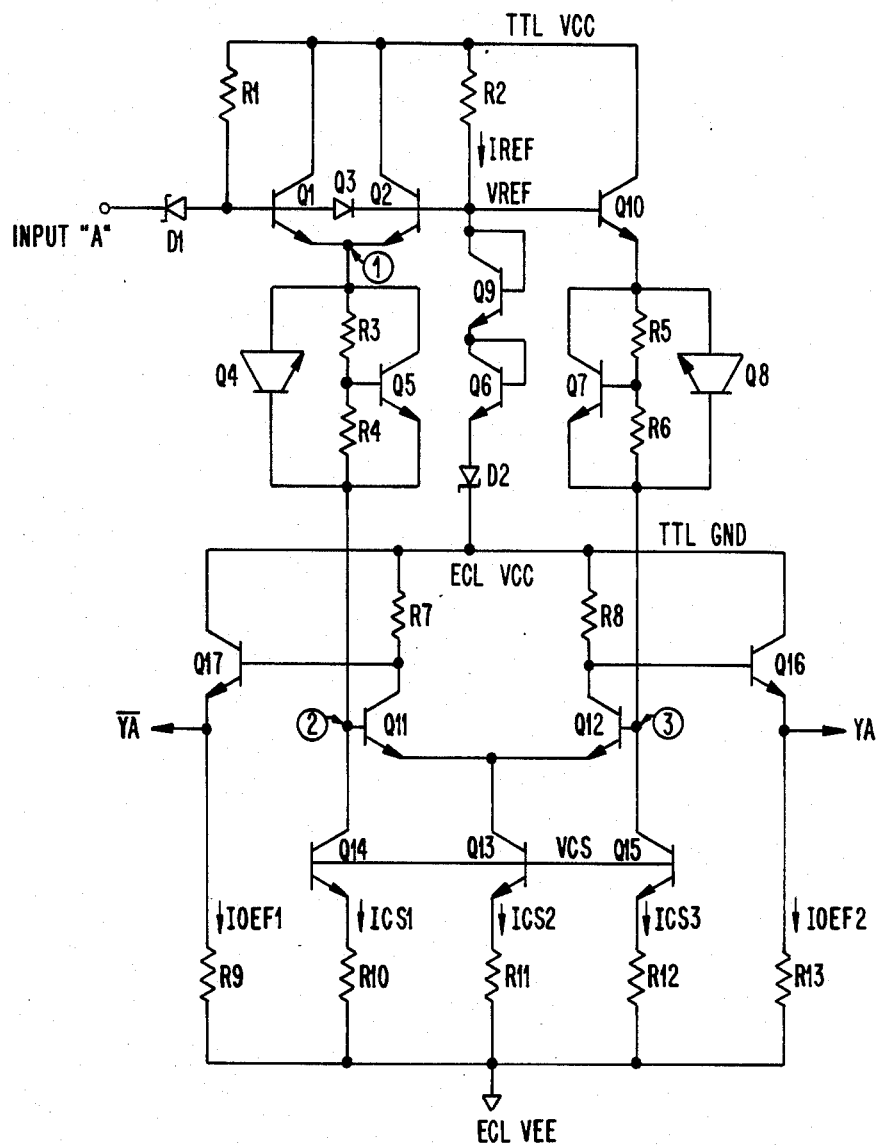
FIG._1.

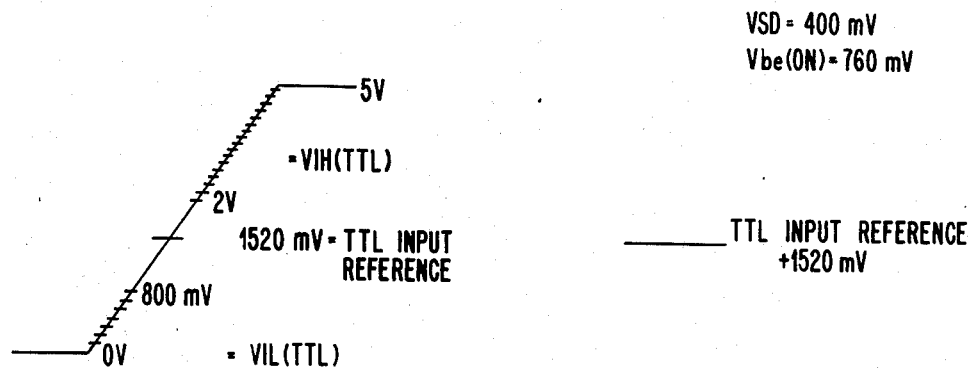
FIG._2A.
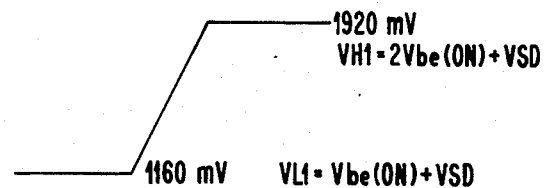
FIG._2B.
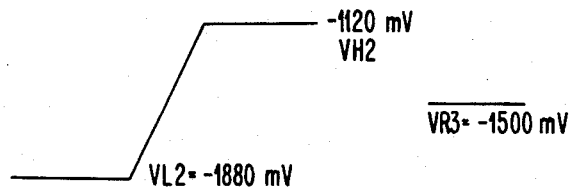
FIG._2C.
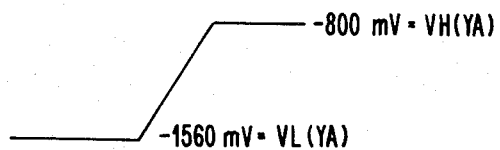
FIG._2D.

TTL-TO-ECL INPUT TRANSLATOR/DRIVER CIRCUIT

BACKGROUND AND PRIOR ART

Field of the Invention

The present invention relates to electronic circuitry and more particularly to voltage level translator circuitry.

BACKGROUND OF THE INVENTION

Two well known and commonly used types of electronic logic circuitry are TTL circuitry and ECL circuitry. TTL circuitry is designed to switch between a low voltage level that ranges from 0.0 volts to 0.8 volts and a high voltage that ranges from 2.0 volts to 5.5 volts. ECL circuitry operates at much lower voltage levels. The type of ECL circuitry of interest to this invention is conventionally designed to switch between voltage levels of minus 1.5 volts and minus 0.8 volts, that is, between $-1500$ millivolts and $-800$ millivolts.

Many circuits can be designed to translate TTL signals to ECL signals. However, the known circuits for translating signals from TTL to ECL levels are relatively slow and they operate at relatively high power levels.

One well known and commonly used translator circuit compares the TTL input signals to a reference voltage. A pseudo-ECL current switch provides true/false output values at pseudo-ECL voltage levels. These pseudo-ECL voltage levels are fed via emitter followers to a resistor ladder. The resistor ladder is differentially tapped at the middle to drive a true ECL current switch which in turn provides normal collector based true/false outputs which can serve as inputs to emitter followers. Such circuitry in effect has two buffers connected in series which introduce a relatively long delay into the signal propagation path.

OBJECTS OF THE INVENTION

The object of the present invention is to provide an improved TTL level to ECL level translator.

Another object of the present invention is to provide a high speed TTL level to ECL level translator.

Yet another object of the present invention is to provide a TTL level to ECL level translator which operates at a relatively low power level.

Still another object of this invention is to provide a high speed low power TTL level to ECL level translator.

A still further object of this invention is to provide a circuit which performs, precise, controlled voltage translations under a wide variation of fabrication, process, temperature, voltage, etc. variations.

SUMMARY OF THE INVENTION

The present invention provides a high speed low power electrical circuit for converting true TTL level signals to true ECL level signals. The circuit only has a single buffer delay with some small additional delay due to an input emitter follower stage. The circuit includes a clamped, switched emitter follower which acts as a level shifting comparator: a self-centering reference threshold translator; a clamped level shifted input translator; and, an ECL Buffer Driver. The circuit also includes a TTL reference and an ECL reference which are tied together. If the TTL reference level shifts slightly due to temperature changes, supply voltage shifts or other factors, the ECL voltage reference will automatically shift by an appropriate percentage to compensate for the original shift in the TTL reference.

DESCRIPTION OF THE DRAWING

FIG. 1 is a circuit diagram of a circuit built in accordance with the present invention.
FIG. 2A shows the TTL input voltage levels.
FIG. 2B shows the voltage levels at node 1.
FIG. 2C shows the voltage levels at node 2.
FIG. 2D shows the ECL voltage levels.

DETAILED DESCRIPTION OF THE PREFERRED EMBODIMENT

The circuit shown in FIG. 1 includes fifteen transistors Q1 to Q15, three diodes D1 to D3, and thirteen resistors R1 to R13.

The purpose of the circuit is to convert from true TTL voltage levels to true ECL voltage levels. The voltage levels at the input of the circuit are shown in FIG. 2A and the voltage at the output is shown in FIG. 2D. The voltage levels at the intermediate nodes 1 and 2 are shown in FIGS. 2B and 2C. The voltage levels at the output of the circuit are shown in FIG. 2D. The cross-hatched lines in FIG. 2A represent an allowable voltage range. The Figure is not meant to be to scale. The range is 800 millivolts on the low side and 3 volts on the high side. FIGS. 2B, 2C and 2D do not show any cross-hatched ranges since at the points illustrated by FIGS. 2B, 2C and 2D the ranges are in the order only 100 millivolts and this is too small to show in the Figures.

The specific values of the resistors is not particularly important. What is significant is the ratio of certain resistors as will be explained in detail later.

Diode D2, transistors Q6 and Q9 and resistor R2, provide an Input reference voltage threshold. In FIG. 2 this is labeled TTL reference. Resistor R1, and transistors Q1, Q2 and Q3 form a clamped level shifting comparator. These circuits produce a well controlled small voltage swing at node 1 in response to the relatively large input voltage changes. In FIG. 2B this voltage is labeled intermediate voltage at node 1.

Transistors Q7, Q8, Q10 and Q15 and resistors R5, R6 and R12 provide a self-centering reference threshold translator. This part of the circuit maintains a relationship between the TTL reference voltage shown in FIG. 2A and the ECL voltage level shown in FIG. 2C. If the TTL voltage reference changes due to changes in temperature or due to other factors, the ECL voltage will change by a fixed percentage of the change in the TTL reference. Thus, the ECL reference at node 3 has the identical dependencies for change in variables such as temperature, supply voltages and process variables as the translated ECL input voltages provides at node 2.

Transistors Q4, Q5, Q14 and resistors R3, R4 and R10 provide a resistor ratioed input voltage translation which precisely lowers the voltage which appears at node 1. Transistors Q11, Q12 and Q13 together with resistors R7, R8, and R11 provide an ECL buffer driver which responds to the level shifted signals and which drives the output.

The operation of each part of the circuit will now be described in detail.

TTL Input Reference Voltage Threshold:

Devices D2, Q6, Q9 and R2 define the input reference threshold for the TTL input circuit. This threshold is shown in FIG. 2A and labeled TTL reference. Its value is calculated as follows:

$$VCC - Iref*R2 - Vbe(Q9) - Vbe(Q6) - Vsd(D2) = 0$$

$$Iref = [VCC - Vbe(Q9) - Vbe(Q6) - Vsd(D2)]/R2$$

Let Vbe(Q6)=Vbe(Q7)=Vbe and Vsd(D2)=Vsd(D1)=Vsd, by design.

$$Vref = Vsd + 2Vbe,$$

and $$V(Q2) = Vref.$$

In this way, this circuit section provides the base of Q2 with Vref = ~2Vbe+Vsd. Note that the true reference voltage as observed at the input is 2Vbe, since Vsd(D2) and Vsd(D1) cancel.

The performance of this circuit across the voltage, temperature stress envelope tracks the behavior of the conventional circuit. Thus, this reference introduces no new system level electrical design constraints.

TTL Input Clamped Level-Shifting Comparator:

Devices R1, Q1, Q2 and Q3 are used to develop a relatively small, well controlled ECL-like voltage at the emitter-tie node, labelled node 1, from the large TTL input voltage transitions. The voltage at node 1 is shown in FIG. 2B.

The voltage at node 1 is generated as follows. Let the input "A" be at VIL, where, with respect to TTL GND, $$VILmin = 0.0 \ V < = VIL < = 0.8 \ V = VILmax$$

Then, D1 conducts IIL current, which is defined by, $$IIL = [VCC - Vsd(D1) - VIL]/R1$$

Consequently, the base of Q1 attains a voltage, $$Vb(Q1) = VIL + Vsd. \tag{iii}$$

From the analysis presented above (Eq.ii) it should be noted that, $$Vb(Q2) = Vref = Vsd + 2Vbe$$

Since 2Vbe is a higher voltage than VILmax, Vb(Q1) is lower than Vb(Q2). Therefore, transistor Q2 develops a full Vbe, and goes into forward-active conduction, while transistor Q1 attains <0.5Vbe, and is considered cut-off. Hence, V(1) follows Vb(Q2), and the current source Ics1 (Q14/R10) is satisfied by Q2, via R3, R4 and Q5. In this way, the V(1) low level is established.

$$V(1)LOW = Vbe + Vsd. \tag{iv}$$

Next, let the input "A" be at VIH, where, with respect to TTL GND, $$VIHmin = 2.0 \ V < = VIL < = 5.0 \ V = VIHmax \tag{v}$$

Since VIHmin is a higher voltage than 2Vbe, D1 conducts reverse-leakage current only. IIH current is conducted through R1 to Q3 into the input reference voltage circuit.

$$IIH = [VCC - Vbe(Q3) - Vref]/R1$$

Transistor Q3 acts as a clamp on Vb(Q1), such that with the input at any voltage greater than VIHmin, e.g., 3Vbe, $$Vb(Q1)max = Vbe(Q3) + Vref = Vbe(Q3) + 1Vb3 + Vsd \tag{vi}$$

$$Vb(Q1)max = 3Vbe + Vsd \tag{vii}$$

From the analysis presented above (Eq. ii) it should be noted that, $$Vb(Q2) = Vref = Vsd + 2Vbe.$$

Vb(Q1) is a higher voltage than Vb(Q2).

Therefore, transistor Q1 develops a full Vbe, and goes into forward-active conduction, while transistor Q2 attains <0.5Vbe, and is considered cut-off.

Hence, V(1) follows Vb(Q1), and the current source Ics1 (q14/R10) is satisfied by Q1, via R3, R4 and Q5.

In this way, the V(1) high level is established.

$$V(1)HIGH = 2Vbe + Vsd. \tag{viii}$$

It should be clear from the operation of the circuit, as explained above, that this circuit is substantially different from the conventional TTL input comparator. The conventional circuit utilizes the same comparator reference, but converts input voltage into pseudo-ECL levels, and then later converts these to true-ECL using the conventional resistor ladder approach. In the novel technique developed in this document, the input stage can be described as a clamped, switched emitter-follower.

Self-Centering Reference Threshold Translator:

This circuit includes devices Q7, Q8 and reactors R5 and R6. It translates the TTL reference shown in FIG. 2A to the ECL reference shown in FIG. 2C. The circuit maintains a relationship between the reference signals over changes in temperature, supply voltage, and changes in process variables. That is, whenever the TTL reference changes, the ECL reference changes by a fixed percentage of the change in the TTL reference. The operation of the Vref-translator circuit is as follows. Let ICs3 represent the current required to satisfy the current source setup by Q15 and R12.

$$Ics3 = [VCS - Vbe(Q15)]/R12$$

Ics3 is sourced by the parallel combination of transistor Q7 and resistor R6. The Ics3 value must be chosen to provide adequate current to bias transistor Q7 in the forward-active mode, while also allowing I(R6) to be satisfied. To first order, $$I(R6) = Vbe(Q7)/R6$$

and, $$Ie(Q7) = Ics3 - I(R6).$$

Note that Vbe(Q7) is in fact a function of Ie(Q7).

$$V(R5) = R5*I(R6) + [Ie(Q7)/(Hfe+1)]$$

where Hfe is the current gain of Q7. Therefore, by an appropriate choice of R5, we can set up an appropriate amount of total voltage level shift provided by this circuit. Let us choose, $$R5:R6 = 2.5:1. \quad \text{(ix)}$$

Then, if we define Hfe to be a large positive number, $$V(R5) = 2.5*V(R6) = 2.5*Vbe(Q7) \quad \text{(x)}$$

Therefore, the total voltage translation from the emitter of transistor Q10 to the base of transistor Q12 is set to be 3.5Vb3.

From our earlier discussion (Eq. ii), $$Vref = Vsd + 2Vbe.$$

Hence, applying the voltage translation derived above, we find that, $$Vb(Q12) = Vref - Vbe(Q10)$$

$$Vb(Q12) = Vsd + 2Vbe - Vbe - 3.5Vbe,$$

or, $$Vb(Q12) = Vsd - 2.5Vbe \quad \text{(xi)}$$

Note the unusual configuration of transistor Q8. The base-emitter and base-collector junctions are reverse biased in parallel. In this way, a large value, space efficient capacitor is obtained. In order to satisfy the current source Ics2, transistor Q12 must build up incremental base charge to attain an appropriate Vbe value. The Q8 capacitor, if sized properly, can transmit an appropriate amount of charge to the base of Q12 much faster than the R6, Q7 combination can, thus providing significant delay performance enhancement.

Clamped Level-Shifted Input Translator:

Incoming TTL input signals are converted into a Vbe voltage delta at node 1, as described earlier. In this section, the operation of the V(1)-translator circuit is described.

Let Ics1 represent the current required to satisfy the current source setup by Q14 and R10.

$$Ics1 = [VCS - Vbe(Q14)]/R10$$

Ics1 is sourced by the parallel combination of transistor Q5 and resistor R4. The Ics1 value must be chosen to provide adequate current to bias transistor Q5 in the forward-active mode, while also allowing I(R4) to be satisfied. To first order, $$I(R4) = Vbe(Q5)/R4$$

and, $$Ie(Q5) = Ics1 - I(r4).$$

Note that Vbe(Q5) is in fact a function of Ie(Q5).

$$V(R3) = R3*I(R4) + [Ie(Q5)/(Hfe+1)]$$

where Hfe is the current gain of Q5. Therefore, by an appropriate choice of R3, we can set up an appropriate amount of total voltage level shift provided by this circuit. Let us choose, $$R3:R4 = 3:1. \quad \text{(xii)}$$

Then, if we define Hfe to be a large positive number, $$V(R3) = 3*V(R4) = 3*Vbe(Q5) \quad \text{(xiii)}$$

Therefore, the total voltage translation from node 1 to the base of transistor Q11 is set to be 4Vbe.

From our earlier discussion (Eq. ii), $$Vref = Vsd + 2Vbe.$$

Hence, applying the voltage translation derived above, we find that, $$Vb(Q11) = V(1) - 4Vbe \quad \text{(xiv)}$$

Applying the earlier V(I)HIGH and V(1)LOW limits, (Eq. iv and viii) we find that, $$Vb(Q11)HIGH = V(1)HIGH - 4Vbe = Vsd - 2Vbe, \quad \text{(xv)}$$

and, $$Vb(Q11)LOW = V(1)LOW - 4Vb3 = Vsd - 3Vbe \quad \text{(xvi)}$$

Comparing Eqs. xv and xvi v. Eq. xi, we find that the original incoming TTL input VIL, VIH voltage values have been interpreted into ECL-type voltage values Vb(Q11)HIGH or Vb(Q11)LOW. Further, an appropriate reference, with excellent inherent tracking, across wide voltage, temperature and process variations, has also been created.

Transistor Q4 has a rather unusual configuration. The base-emitter and base-collector junctions are reverse biased in parallel. In this way, a large value, space efficient capacitor is obtained. When an input transition is detected, the Q4 capacitor, if sized properly, transmits an appropriate amount of charge to the base of Q11 much faster than the R4, Q5 combination can, thus providing significant delay performance enhancement. The output emitter followers Q17/Ioef1 and Q16 / Ioef2 perform the normal voltage level-shifting and provide current drive capability.

ECL Buffer Driver:

The key to the optimal performance of this circuit lies in the creation of the Vb(Q11) and Vb(Q12) voltages as described above. Once those appropriately conditioned voltages are available, the ECL current switch operates in the normal manner. Resistors R7, R8 and R11, and transistors Q11, Q12 and Q13 form the ECL current switch. If Vb(Q11) > Vb(Q12), then Ics2 is satisfied from ECL VCC via R7, and Vb(Q17) attains an ECL LOW output level, while Vb(Q16) attains an ECL HIGH level. Conversely, if Vb(Q11) < Vb(Q12) then Ics2 is satisfied from ECL VCC via R8, and Vb(Q16) attains an ECL LOW output level, while Vb(Q17) attains an ECL HIGH level.

While the invention has been shown and describes with reference to a preferred embodiment thereof, it should be understood that various changes in form and detail are possible without departing from the spirit and scope of the invention. The scope of applicants invention is set forth in the following claims.

What is claimed is:

1. A high speed low power voltage translation circuit for translating input signals that vary between relatively large first and second positive voltages into output signals that vary between relatively small third and fourth negative voltage levels comprising:

means for providing a first positive voltage threshold reference having a value between said first and second voltages;

a circuit node;

means, responsive to the input signals, for generating an intermediate voltage at said circuit node, said intermediate voltage being positive and having a relatively small voltage swing;

a self-centering reference translator means for translating said first positive voltage threshold reference into a second voltage threshold having a value between said third and fourth voltage levels; and buffer driver means responsive to the voltages at said circuit node and to said second voltage threshold for generating said output signals.

2. The circuit recited in claim 1 wherein said circuit includes a constant current source and said means for generating an intermediate voltage at said circuit node comprises first, second and third transistors, a diode and a resistor, the collectors and the emitters of said transistors being connected together, the bases of said transistors being connected by said diode, the base of said first transistor being connected to said TTL input, the emitters of said transistors being connected to said constant source, whereby depending on the value of the signal at said input, current passes through either said first or said second transistors.

3. The circuit recited in claim 1 wherein said self-centering reference translator means includes first and second transistors and first and second resistors, said resistors being connected in series from said first reference to said second reference, said first transistor having its collector connected to said first reference, its emitter connected to the second reference and its base connected to the midpoint of said resistors, said second transistor having both its emitter and its base connected to said first reference and its base connected to said second reference.

4. The circuit recited in claim 1 wherein said buffer driver means comprises, first, second and third resistors, and first, second and third transistors, connected to form an ECL current switch, a first side of said switch being connected to said ECL reference and the second side of said switch being connected to said circuit node through a level shifter.

5. A high speed low power voltage translation circuit for translating TTL input signals that vary between nominal values of 0.4 volts and 3.5 volts into ECL signals that vary between nominal values of −1500 millivolts and −800 millivolts comprising:

means for providing a first positive voltage threshold reference having a value equal to two transistor base-emitter junction voltages;

a circuit node;

a TTL input comparator having first and second transistors, a Schottky diode and a constant current source, the base of said first transistor being connected to receive said input signal via said Schottky diode, and the base of said second transistor being connected to said reference voltage, the emitter of said transistors being connected to said circuit node, said constant current source connected to draw current from either said first or said second transistor depending up whether said input signal is higher or lower than said first positive voltage threshold, whereby an intermediate positive voltage is generated at said circuit node, said intermediate voltage changing between 1.16 volts and 1.92 volts in response to changes in said TTL input signal;

a self-centering reference translator means for translating said first positive voltage threshold reference into a negative ECL voltage threshold which tracks said first voltage threshold reference; and buffer driver means responsive to the voltages at said circuit node and to said second voltage threshold for generating said ECL output signals.

6. A high speed low power circuit for translating TTL input voltages into ECL output voltages comprising:

circuit means for generating a TTL input reference signal;

a circuit node;

an input clamped level shifting comparator for comparing said TTL voltages to said TTL input reference signal and for generating an intermediate voltage signal at said circuit node;

a self-centering reference threshold translator means for translating said TTL reference signal to an ECL reference signal;

an ECL buffer driver responsive to signals at said circuit node and to said ECL reference signal for generating said ECL output voltages.

7. The circuit recited in claim 6 wherein said circuit means for generating a TTL input reference signal comprises, a resistor, first and second transistors and a diode connected in series, each transistor having a base and a collector, a connection between the base and the collector of each of said transistors, said resistor being connected to the emitter of said first transistor, the emitter of the first transistor being connected to the collector of said second transistor, said diode being connected to the emitter of said second transistor.

* * * * *